(12) United States Patent
Kim

(10) Patent No.: US 9,142,319 B2
(45) Date of Patent: Sep. 22, 2015

(54) SEMICONDUCTOR DEVICE EMPLOYING FUSE PROGRAMMING

(75) Inventor: Kwi-Dong Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 239 days.

(21) Appl. No.: 13/595,615

(22) Filed: Aug. 27, 2012

(65) Prior Publication Data

US 2013/0279279 A1    Oct. 24, 2013

(30) Foreign Application Priority Data

Apr. 23, 2012    (KR) .................. 10-2012-0042165

(51) Int. Cl.
*G11C 17/18* (2006.01)
*G11C 17/16* (2006.01)

(52) U.S. Cl.
CPC ............... *G11C 17/18* (2013.01); *G11C 17/16* (2013.01)

(58) Field of Classification Search
CPC ................................ G11C 17/18; G11C 17/16
USPC ............... 365/96, 104, 225.7, 189.05, 189.07
See application file for complete search history.

(56) References Cited

U.S. PATENT DOCUMENTS

| | | | |
|---|---|---|---|
| 7,046,569 B2 * | 5/2006 | Ito et al. ........................ | 365/225 |
| 7,345,903 B2 * | 3/2008 | Nakano et al. .................. | 365/96 |
| 2006/0193163 A1 * | 8/2006 | Ito ................................. | 365/149 |

FOREIGN PATENT DOCUMENTS

| | | |
|---|---|---|
| KR | 100732389 | 6/2007 |
| KR | 101007988 | 1/2011 |
| KR | 1020120011148 | 2/2012 |

* cited by examiner

*Primary Examiner* — Thao H Bui
(74) *Attorney, Agent, or Firm* — IP & T Group LLP

(57) ABSTRACT

A semiconductor device includes a fuse unit connected to a detection node and configured to be programmed in response to a first voltage supplied through the detection node, an output unit connected to the detection node and configured to output a fuse information signal indicating whether the fuse unit is programmed or not, and a blocking unit configured to block the first voltage supplied through the detection node in response to the fuse information signal.

20 Claims, 7 Drawing Sheets

SEMICONDUCTOR DEVICE EMPLOYING FUSE PROGRAMMING

CROSS-REFERENCE TO RELATED APPLICATIONS

The present application claims priority of Korean Patent Application No. 10-2012-0042165, filed on Apr. 23, 2012, which is incorporated herein by reference in its entirety.

BACKGROUND

1. Field

Exemplary embodiments of the present invention relate to semiconductor design technology, and more particularly, to a semiconductor device including a fuse unit.

2. Description of the Related Art

In general, a semiconductor device such as DRAM (Dynamic Random Access Memory) includes a fuse circuit. The fuse circuit is a circuit that inverts and outputs a previous option signal through a fuse programming method, and it is used in a voltage control circuit, a redundancy circuit or the like to selectively provide an option signal.

In general, the fuse programming method may include a laser blowing method and an electrical method. The laser blowing method is to cut off the connection state of a fuse using laser beams. The fuse programming method using laser beams may be performed only in a wafer state before a semiconductor device is fabricated into a package. On the other hand, the electrical method is to program a fuse by changing the connection state of the fuse in a package state of semiconductor device fabrication. At this time, an anti-fuse may be used as the fuse.

The anti-fuse has an opposite concept to a prevalent fuse. Specifically, the anti-fuse is set to be cut off at the initial stage of semiconductor device fabrication, and then it is switched to a connection state by a program operation after packaging. In other words, the anti-fuse at the initial stage of fabrication is maintained as an insulator having a high resistance of $M\Omega$ or more, but it is then changed into a conductor having a low resistance of several hundred $\Omega$ or less depending on a program operation. Here, the physical change of the anti-fuse is performed as follows. When a voltage having a given level or more is applied between two conductive layers of the anti-fuse to break down insulation characteristics, the anti-fuse is switched into a conductor.

FIG. 1 is a configuration diagram of a conventional anti-fuse circuit.

Referring to FIG. 1, the anti-fuse circuit 10 includes an anti-fuse 12 and an output unit 14. The anti-fuse 12 is configured to be programmed when a voltage difference equal to or more than a critical value occurs between both ends thereof. The output unit 14 is configured to output a fuse information signal SA corresponding to a rupture state of the anti-fuse 12.

Here, the anti-fuse 12 includes an NMOR transistor N1 having a gate terminal configured to receive a selectively-provided power supply voltage VDD and source and drain terminals connected to a detection node ND1.

The output unit 14 includes a resistor 14A and a sense amplifier 14B. The resistor 14A is connected between the detection node ND1 and a ground voltage terminal VSS, and the sense amplifier 14B is connected to the detection node ND1 and configured to amplify the voltage level of the detection node ND1 and output the fuse information signal SA.

Hereinafter, an operation of the anti-fuse circuit 10 having the above-described configuration will be described with reference to FIGS. 2A and 2B.

FIG. 2A illustrates an equivalent circuit of the anti-fuse circuit which is not programmed. FIG. 2B illustrates an equivalent circuit of the anti-fuse circuit 10 which is programmed.

First, referring to FIG. 2A, since the power supply voltage VDD is not supplied when program is not performed (floating state), the anti-fuse 12 is not broken down. That is, the current state of the anti-fuse does not satisfy a condition for applying stress, corresponding to such a level as to program the anti-fuse 12, to both ends of the anti-fuse 12. Accordingly, since the anti-fuse 12 operates as a capacitor C1, the anti-fuse 12 is maintained as an insulator having a high resistance. Therefore, the detection node ND1 is connected to the ground voltage VSS, and the sense amplifier 14B outputs the fuse information signal SA of a logic low level.

On the other hand, referring to FIG. 2B, since the power supply voltage VDD is supplied when program is performed, the current state satisfies the condition where the anti-fuse 12 is programmed. That is, since a voltage difference corresponding to such a level as to program the anti-fuse 12 may occur between both ends of the anti-fuse 12, the anti-fuse 12 may be broken down. Accordingly, since the anti-fuse 12 operates as a resistor R2, the anti-fuse 12 is switched to a conductor having a low resistance. Therefore, the detection node ND1 has a voltage level between the power supply voltage VDD and the ground voltage VSS, the sense amplifier 14B outputs the fuse information signal SA of a logic high level.

SUMMARY

An embodiment of the present invention is directed to a semiconductor device capable of preventing the occurrence of current path during fuse programming.

In accordance with an exemplary embodiment of the present invention, a semiconductor device includes a fuse unit connected to a detection node and configured to be programmed in response to a first voltage supplied through the detection node, an output unit connected to the detection node and configured to output a fuse information signal indicating whether the fuse unit is programmed or not; and a blocking unit configured to block the first voltage supplied through the detection node in response to the fuse information signal.

In accordance with another exemplary embodiment of the present invention, a semiconductor device includes a plurality of detection nodes, a plurality of fuse blocks each including a plurality of fuse units configured to be programmed in response to first program voltages of respective input nodes and a second program voltage of one of the detection nodes, a plurality of output units configured to selectively output respective fuse information signals indicating whether the fuse units of the respective fuse blocks are programmed or not, and a plurality of switching units configured to supply the second program voltage to the respective detection nodes in response to respective enable signals and block the second program voltage supplied to the respective detection nodes in response to the respective fuse information signals.

In accordance with yet another exemplary embodiment of the present invention, a semiconductor device includes, a plurality of detection nodes, a plurality of fuse blocks each including a plurality of fuse units configured to be programmed in response to first program voltages of respective input nodes and a second program voltage of one of the detection nodes, a plurality of output units configured to selectively output respective fuse information signals indicating whether the fuse units of the respective fuse blocks are programmed or not, a determination unit configured to determine whether the fuse units of the fuse blocks are programmed or not, in response to the fuse information signals, and output at least one program determination signal, a plurality of switching units configured to supply the second program voltage to the respective detection nodes in response to respective enable signals, a first decoder configured to selectively supply the first program voltages to the plurality of fuse units, and a second decoder configured to selectively generate the enable signals and deactivate a part or all of the enable signals in response to the program determination signal.

DETAILED DESCRIPTION

Figure 1:
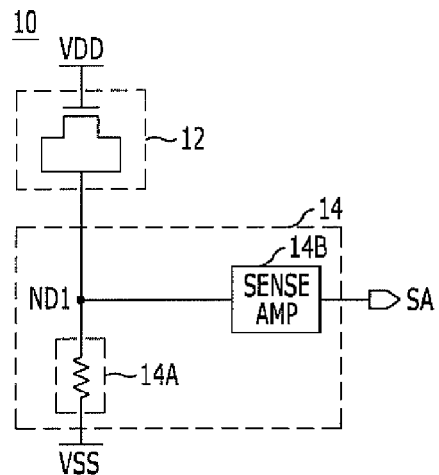
FIG. 1 is a configuration diagram of a conventional anti-fuse circuit.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
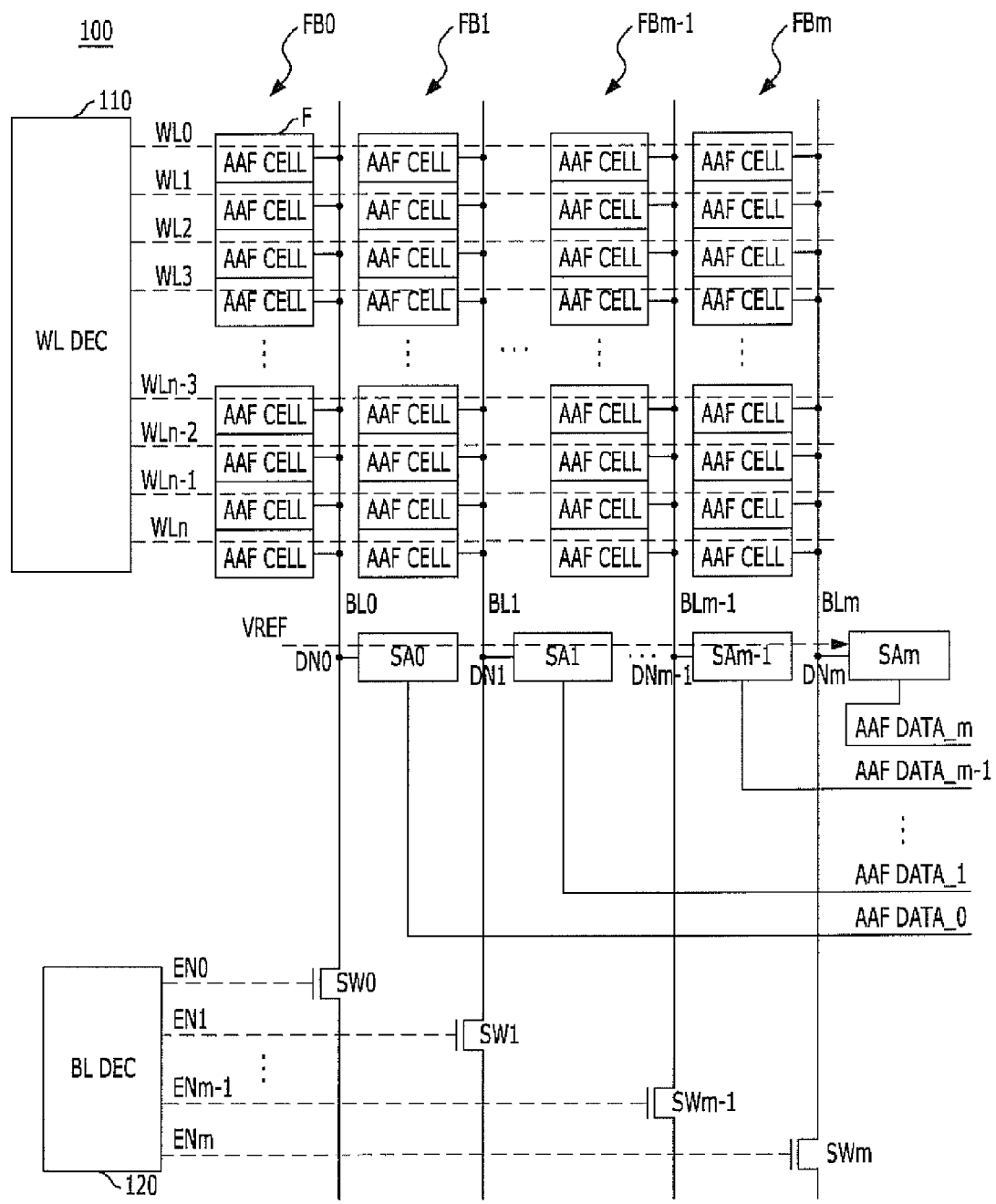
FIG. 3 is a configuration diagram for illustrating a basic structure of a semiconductor device in accordance with an exemplary embodiment of the present invention.

FIG. 3 is a configuration diagram for illustrating a basic structure of a semiconductor device in accordance with an exemplary embodiment of the present invention, prior to describing the semiconductor device in detail.

Referring to FIG. 3, the semiconductor device 100 includes a plurality of fuse blocks FB0 to FBm, a plurality of output units SA0 to SAm, a plurality of switching units SW0 to SWm, a decoder 110, and a bit line decoder 120. The plurality of fuse blocks FB0 to FBm each include a plurality of fuse units AAF_CELL connected in parallel to a corresponding one of a plurality of detection nodes DN0 to DNm and configured to receive a power supply voltage VDD through a plurality of word lines WL0 to WLn, respectively. The plurality of output units SA0 to SAm are connected to the respective detection nodes DN0 to DNm and configured to selectively output respective fuse information signals depending on whether the corresponding fuse units AAF_CELL are programmed or not. The plurality of switching units SW0 to SWm are configured to selectively supply a ground voltage VSS to the plurality of detection nodes DN0 to DNm through a plurality of bit lines BL0 to BLm, in response to a plurality of enable signals EN0 to ENm, respectively. The decoder 110 is configured to supply the power supply voltage VDD through any one of the word lines WL0 to WLn. The bit line decoder 120 is configured to selectively supply the enable signals EN0 to ENm.

Figure 2A:
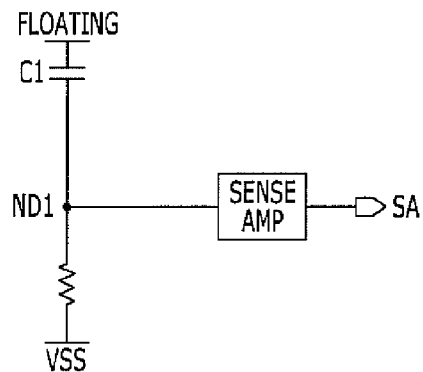
FIGS. 2A and 2B are diagram illustrating an equivalent circuit of the anti-fuse circuit shown in FIG. 1.
Figure 2B:
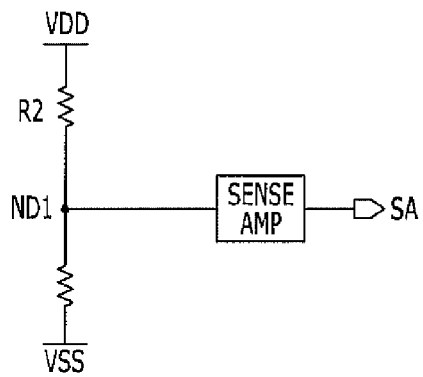

Here, each of the unit fuses AAF_CELL includes an anti-fuse, and the anti-fuse is programmed by a voltage difference between both ends thereof, for example, as the power supply voltage VDD and the ground voltage VSS are applied to the both ends (refer to FIGS. 1 to 2B).

Furthermore, the plurality of output units SA0 to SAm include sense amplifiers configured to amplify voltages applied to the respective detection nodes DN0 to DNm using a common reference voltage VREF.

Furthermore, the plurality of switching units SW0 to SWm include NMOS transistors having gate terminals configured to receive the respective enable signals EN0 to ENm and drain and source terminals between the respective detection nodes DN0 to DNm and the ground voltage terminal VSS.

Hereinafter, the operation of the semiconductor device 100 having the above-described configuration will be described. In the following descriptions, a case in which a first fuse unit indicated by F in FIG. 3 is programmed will be shown as an example.

First, the first fuse unit F is selected by a combination of the word lines WL0 to WLn and the bit lines BL0 to BLm. In other words, the word line decoder 110 supplies the power supply voltage VDD through the first word line WL0 and the ground voltage VSS through the other word lines WL1 to WLn. Furthermore, the bit line decoder 120 activates the first enable signal EN0 to a logic high level (for example, VDD) and deactivates the other enable signals EN1 to ENm to a logic low level (for example, VSS). Then, the first bit line BL0 is selected to connect the first detection node DN0 to the ground voltage terminal VSS.

Accordingly, the power supply voltage VDD and the ground voltage VSS are applied to both ends of the first fuse unit F, and the first fuse unit F is programmed by a voltage difference between the power supply voltage VDD and the ground voltage VSS. That is, the anti-fuse included in the first fuse unit F is switched from an insulator having a high resistance of MΩ or more to a conductor having a low resistance of several hundred Ω or less by the voltage difference between both ends thereof.

According to the semiconductor device 100, fuse programming may be performed even in a package state.

In the semiconductor device 100 having the above-described configuration, however, a current path occurs between the power supply voltage terminal VDD and the ground voltage terminal VSS through the first fuse unit F, after the first fuse unit F is programmed. In this case, power noise occurs in the power supply voltage VDD and the ground voltage VSS, and the voltage levels are not fixed to the target levels but fluctuate. At this time, when another fuse unit is programmed at the same time, the program operation may not be properly performed by the power noise. Furthermore, an additional time may be consumed for a recovery to program the next fuse unit.

Meanwhile, the activation period of the enable signals EN0 to ENm may be minimized. However, since it takes different times to program the plurality of fuse units depending on element conditions and voltage conditions, there are difficulties in defining a proper activation period for the enable signals EN0 to ENm. In other words, when the activation period of the enable signals EN0 to ENm is defined as a minimum critical value, a fuse unit which is not programmed may exist, and when the activation period of the enable signals EN0 to ENm is defined as a maximum critical value, power noise occurs due to a current path formed between the power supply voltage terminal VDD and the ground voltage terminal VSS, after program is completed.

Hereinafter, a semiconductor device capable of dynamically controlling the activation period of the enable signals EN0 to ENm will be disclosed.

Figure 4:
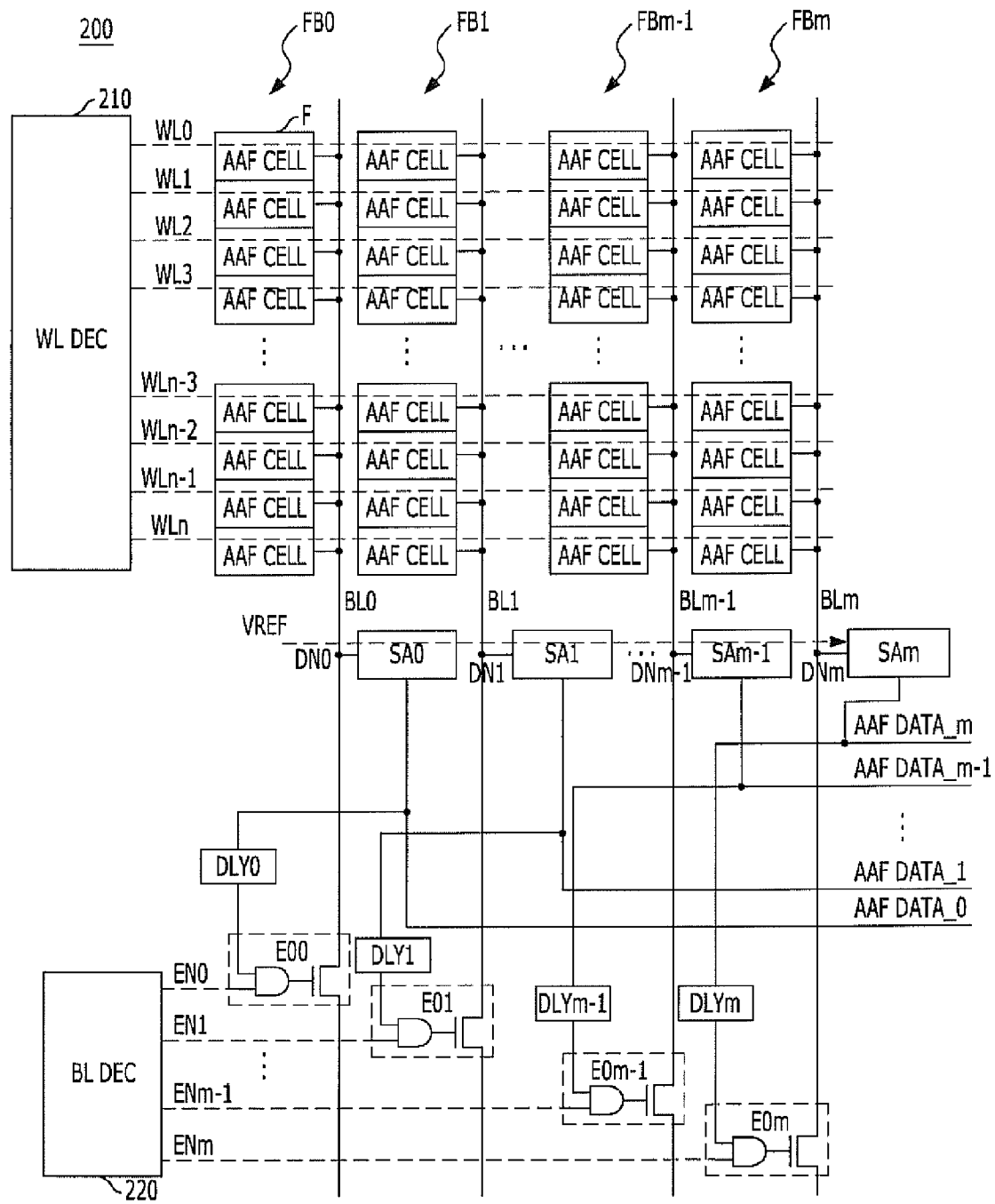
FIG. 4 is a configuration diagram of a semiconductor device in accordance with a first exemplary embodiment of the present invention.

FIG. 4 is a configuration diagram of a semiconductor device in accordance with a first exemplary embodiment of the present invention.

Referring to FIG. 4, the semiconductor device 200 includes a plurality of fuse blocks FB0 to FBm, a plurality of output units SA0 to SAm, a plurality of blocking units E00 to E0m, a decoder 210, and a bit line decoder 220. The plurality of fuse blocks FB0 to FBm each include a plurality of fuse units AAF_CELL connected in parallel to a corresponding one of a plurality of detection nodes DN0 to DNm and configured to receive a power supply voltage VDD through a plurality of word lines WL0 to WLn, respectively. The plurality of output units SA0 to SAm are connected to the respective detection nodes DN0 to DNm and configured to selectively output respective information signals AAF_DATA_0 to AAF_DATA_m depending on whether corresponding fuse units AAF_CELL are programmed or not. The plurality of blocking units E00 to E0m are configured to individually block ground voltages VSS supplied to the respective detection nodes DN0 to DNm, in response to the fuse information signals AAF_DATA_0 to AAF_DATA_m outputted from the output units SA0 to SAm and a plurality of enable signals EN0 to ENm, respectively. The decoder 210 is configured to selectively supply the power supply voltage VDD through the word lines WL0 to WLn. The bit line decoder 220 is configured to selectively supply the enable signals EN0 to ENm.

Here, each of the fuse units AAF_CELL includes an anti-fuse, and the anti-fuse is programmed by a voltage difference between both ends thereof, for example, as the power supply voltage VDD and the ground voltage VSS are applied to both ends (refer to FIGS. 1 to 2B).

Furthermore, the plurality of output units SA0 to SAm include sense amplifiers configured to amplify voltages applied to the respective detection nodes DN0 to DNm using a common reference voltage VREF.

Furthermore, the plurality of blocking units E00 to E0m include AND gates and NMOS transistors, respectively. The AND gates are configured to perform an AND operation on the fuse information signals AAF_DATA_0 to AAF_DATA_m outputted from the respective output units SA0 to SAm and the respective enable signals EN0 to ENm. The NMOS transistors have gate terminals configured to receive output signals of the respective AND gates and drain and source terminals connected between the respective detection nodes DN0 to DNm and the ground voltage terminal VSS.

Meanwhile, the semiconductor device 200 may further include a plurality of delay units DLY0 to DLYm configured to delay the fuse information signals AAF_DATA_0 to AAF_DATA_m outputted from the respective output units SA0 to SAm by a given delay time and transfer the delayed signals to the respective blocking units E00 to E0m. This is in order to sufficiently secure a program time for the fuse unit AFF_CELL to prevent the occurrence of a recovery phenomenon where the fuse unit AFF_CELL returns to the previous state after the fuse unit AFF_CELL is programmed. In other words, since the anti-fuse is highly likely to recover immediately after the anti-fuse is ruptured, the plurality of delay units DLY0 to DLYm are provided to terminate the rupture operation after securing a time taken for the anti-fuse not to recover.

Hereinafter, a method for driving the semiconductor device 200 in accordance with the first embodiment of the present invention will be described. In the first embodiment of the present invention, a case in which a first fuse unit AAF_CELL indicated by F in FIG. 4 is programmed will be shown as an example.

First, the first fuse unit F is selected by a combination of the word lines WL0 to WLn and the bit lines BL0 to BLm. That is, the word line decoder 210 supplies the power supply voltage VDD through the first word line WL0 and supplies the ground voltage VSS through the other word lines WL1 to WLn. Furthermore, the bit line decoder 220 activates the first enable signal EN0 to a logic high level (for example, VDD) and deactivates the other enable signals EN1 to ENm to a logic low level (for example, VSS). Then, the first bit line BL0 is selected to connect the first detection node DN0 to the ground voltage terminal VSS. Here, the plurality of output units SA0 to SAm may output the high-level fuse information signals AAF_DATA_0 to AAF_DATA_m before the fuse units AAF_CELL are programmed.

Accordingly, the power supply voltage VDD and the ground voltage VSS are applied to both ends of the first fuse unit F, and the first fuse unit F is programmed by a voltage difference between the power supply voltage VDD and the ground voltage VSS. That is, the anti-fuse included in the first fuse unit F is switched from an insulator having a high resistance of $M\Omega$ or more to a conductor having a low resistance of several hundred $\Omega$ or less by the voltage difference between both ends.

Then, while the first detection node DN0 is connected to the ground voltage terminal VSS, the first output unit SA0 outputs the low-level first fuse detection signals AAF_DATA_0, and the first blocking unit E00 blocks a current path formed in the first bit line BL0 regardless of the first enable signal EN0 after a given time.

Figure 5:
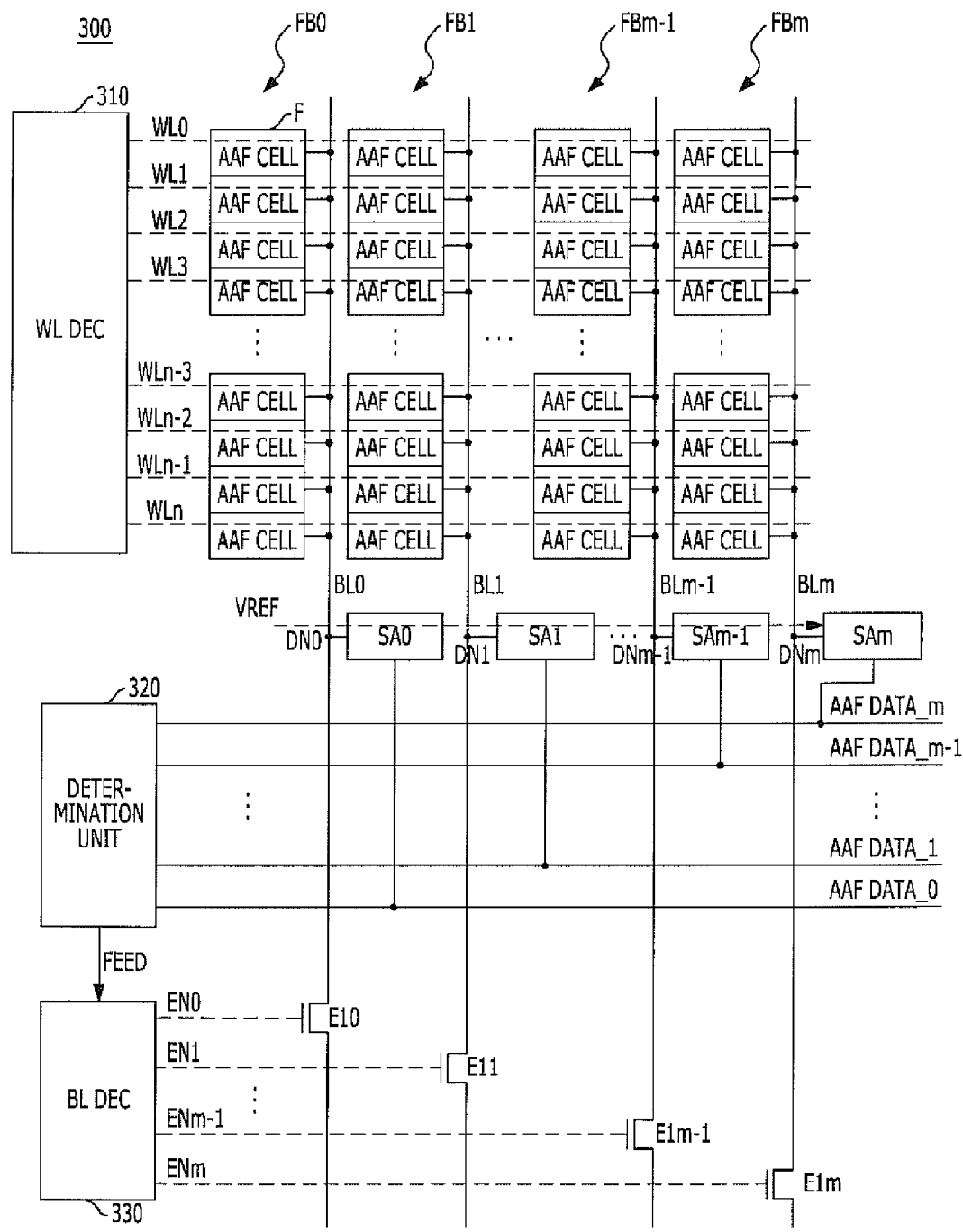
FIGS. 5 and 6 are configuration diagrams of a semiconductor device in accordance with a second exemplary embodiment of the present invention.

FIG. 5 is a configuration diagram of a semiconductor device in accordance with a second exemplary embodiment of the present invention.

Referring to FIG. 5, the semiconductor device 300 includes a word line decoder 310, a plurality of fuse blocks FB0 to FBm, a plurality of output units SA0 to SAm, a determination unit 320, a bit line decoder 330, and a plurality of blocking units E10 to E1m. The word line decoder 310 is configured to selectively supply a power supply voltage VDD through a plurality of word lines WL0 to WLn. The plurality of fuse blocks FB0 to FBm each include a plurality of fuse units AAF_CELL connected in parallel to a corresponding one of a plurality of detection nodes DN0 to DNm and configured to receive the power supply voltage VDD through the respective word lines WL0 to WLn. The plurality of output units SA0 to SAm are connected to the respective detection nodes DN0 to DNm and configured to output respective fuse information signals AAF_DATA_0 to AAF_DATA_m depending on whether the corresponding fuse units AAF_CELL are programmed or not. The determination unit 320 is configured to determine whether the fuse units AAF_CELL included in the fuse blocks FB0 to FBm are programmed or not, in response to the fuse information signals AAF_DATA_0 to AAF_DATA_M outputted from the respective output units SA0 to SAm. The bit line decoder 330 is configured to selectively generate a plurality of enable signals EN0 to ENm and deactivate all the plurality of enable signals EN0 to ENm in response to a program determination signal FEED outputted from the determination unit 310. The plurality of blocking units E10 to E1m are configured to block ground voltages VSS supplied to the detection nodes DN0 to DNm in response to the respective enable signals EN0 to ENm.

Here, each of the fuse units AAF_CELL includes an anti-fuse, and the anti-fuse is programmed by a voltage difference between both ends thereof, for example, as the power supply voltage VDD and the ground voltage VSS are applied to both ends (refer to FIGS. 1 to 2B).

Furthermore, the plurality of output units SA0 to SAm include sense amplifiers configured to amplify voltages applied to the respective detection nodes DN0 to DNm using a common reference voltage VREF.

Furthermore, the determination unit 320 may include logic elements such as an OR gate, a NOR gate, an AND gate, and a NAND gate. When any one of the fuse information signals AAF_DATA_0 to AAF_DATA_m changes to a different level, the determination unit 320 activates the program determination signal FEED to disable the bit line decoder 330.

Furthermore, the plurality of blocking units E10 to E1$m$ include NMOS transistors having gate terminals configured to receive the respective enable signals EN0 to ENm and drain and source terminals connected between the respective detection nodes DN0 to DNm and the ground voltage terminal VSS.

Meanwhile, although not illustrated, the semiconductor device 300 may further include a plurality of delay units configured to delay the fuse information signals AAF_DATA_0 to AAF_DATA_m outputted from the respective output units SA0 to SAm by a given delay time and transfer the delayed signals to the determination unit 320 (refer to FIG. 4). This is in order to sufficiently secure a program time for the fuse unit AFF_CELL to prevent the occurrence of a recovery phenomenon where the fuse unit AFF_CELL returns to the previous state after the fuse unit AFF_CELL is programmed. In other words, since the anti-fuse is highly likely to recover immediately after the anti-fuse is ruptured, the plurality of delay units DLY0 to DLYm are provided to terminate the rupture operation after securing a time taken for the anti-fuse not to recover.

Hereinafter, a method for driving the semiconductor device 300 in accordance with the second exemplary embodiment of the present invention will be described. In the second embodiment of the present invention, a case in which a first fuse unit AAF_CELL indicated by F in FIG. 5 is programmed will be shown as an example for description.

First, the first fuse unit F is selected by a combination of the word lines WL0 to WLn and the bit lines BL0 to BLm. That is, the word line decoder 310 supplies the power supply voltage VDD through the first word line WL0 and supplies the ground voltage VSS through the other word lines WL1 to WLn. Furthermore, the bit line decoder 320 activates the first enable signal EN0 to a logic high level (for example, VDD) and deactivates the other enable signals EN1 to ENm to a logic low level (for example, VSS). Then, the first bit line BL0 is selected to connect the first detection node DN0 to the ground voltage terminal VSS. Here, the plurality of output units SA0 to SAm may output the high-level fuse information signals AAF_DATA_0 to AAF_DATA_m before the fuse units AAF_CELL are programmed, and the determination unit 320 may output the low-level program determination signal FEED in response to the high-level fuse information signals AAF_DATA_0 to AAF_DATA_m.

Accordingly, the power supply voltage VDD and the ground voltage VSS are applied to both ends of the first fuse unit F, and the first fuse unit F is programmed by a voltage difference between the power supply voltage VDD and the ground voltage VSS. That is, the anti-fuse included in the first fuse unit F is switched from an insulator having a high resistance of MΩ or more to a conductor having a low resistance of several hundred Ω or less by the voltage difference between both ends.

Then, while the first detection node DN0 is connected to the ground voltage terminal VSS, the first output unit SA0 outputs the low-level first fuse detection signals AAF_DATA_0, and the determination unit 320 outputs the high-level program determination signal FEED in response to the low-level first fuse detection signal AAF_DATA_0.

Therefore, while the bit line decoder 330 is disabled, the plurality of enable signals EN0 to ENm are deactivated to a logic low level, and the plurality of blocking units E10 to E1$m$ collectively perform a blocking operation. At this time, a current path formed in the first bit line BL0 is blocked.

Figure 6:
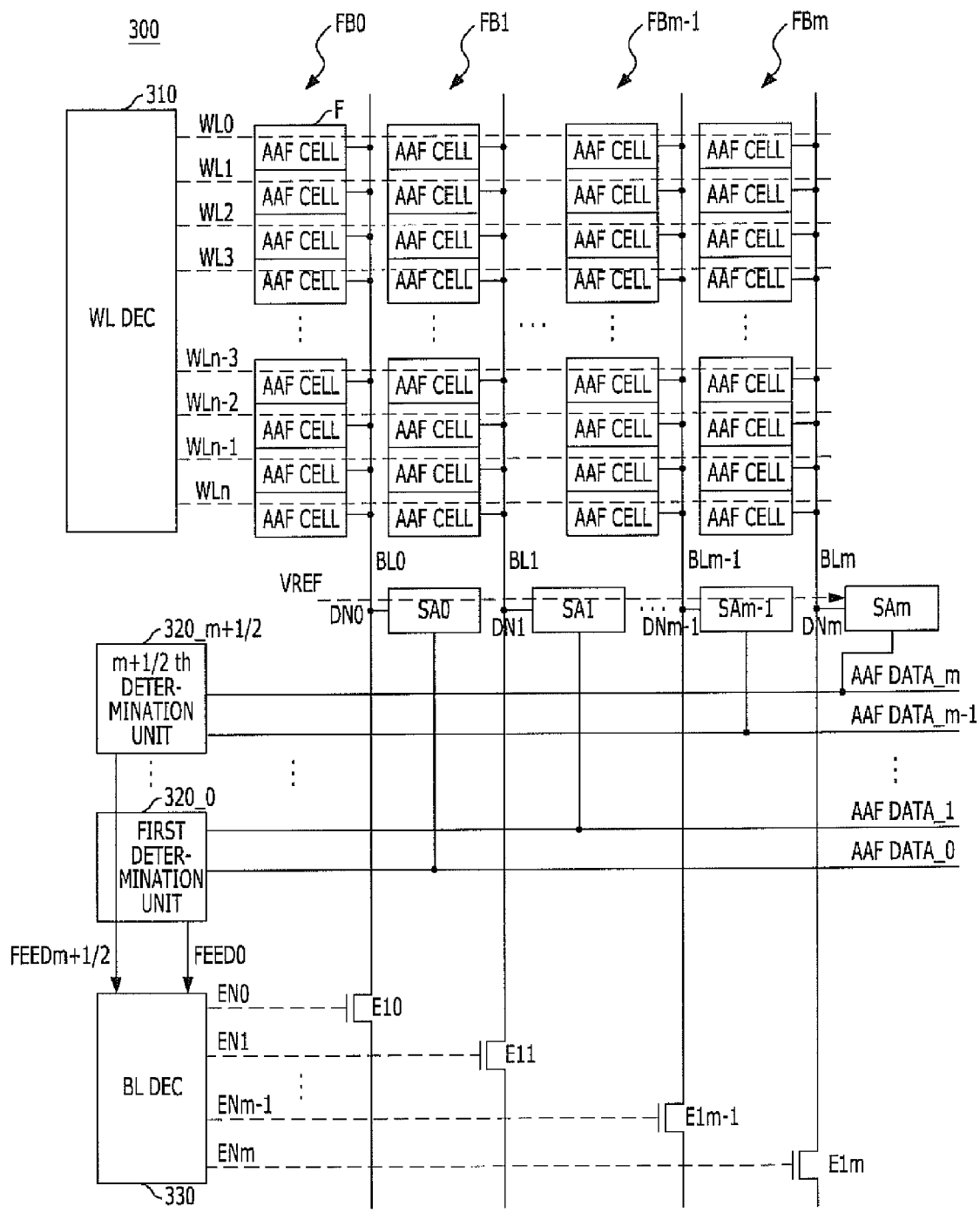

In the second embodiment of the present invention, it has been described that the determination unit 320 outputs one program determination signal FEED in response to the plurality of fuse information signals AAF_DATA_0 to AAF_DATA_m, but the present invention is not limited thereto. That is, the plurality of fuse information signals AAF_DATA_0 to AAF_DATA_m may be grouped by a given number, and a plurality of determination units may be provided in correspondence to the group number. In this case, the bit line decoder 330 is designed to group the plurality of enable signals EN0 to ENm by the given number in response to the grouping and partially deactivates the plurality of enable signals EN0 to ENm in response to output signals of the determination units. For example, referring to FIG. 6, when any one of the first and second fuse information signals AAF_DATA_0 and AAF_DATA_1 transits to a given logic level, the bit line decoder 330 deactivates all the first and second enable signals EN0 and EN1 under the control of a first determination unit 320_0. Similarly, when any one of the m-th and (m+1)-th fuse information signals AFF_DATA_m−1 and AAF_DATA_m transits to a given logic level, the bit line decoder 330 deactivates all the m-th and (m+1)-th enable signals ENm−1 and ENm under the control of an (m+½)-th determination unit 320_$m$+½.

Figure 7:
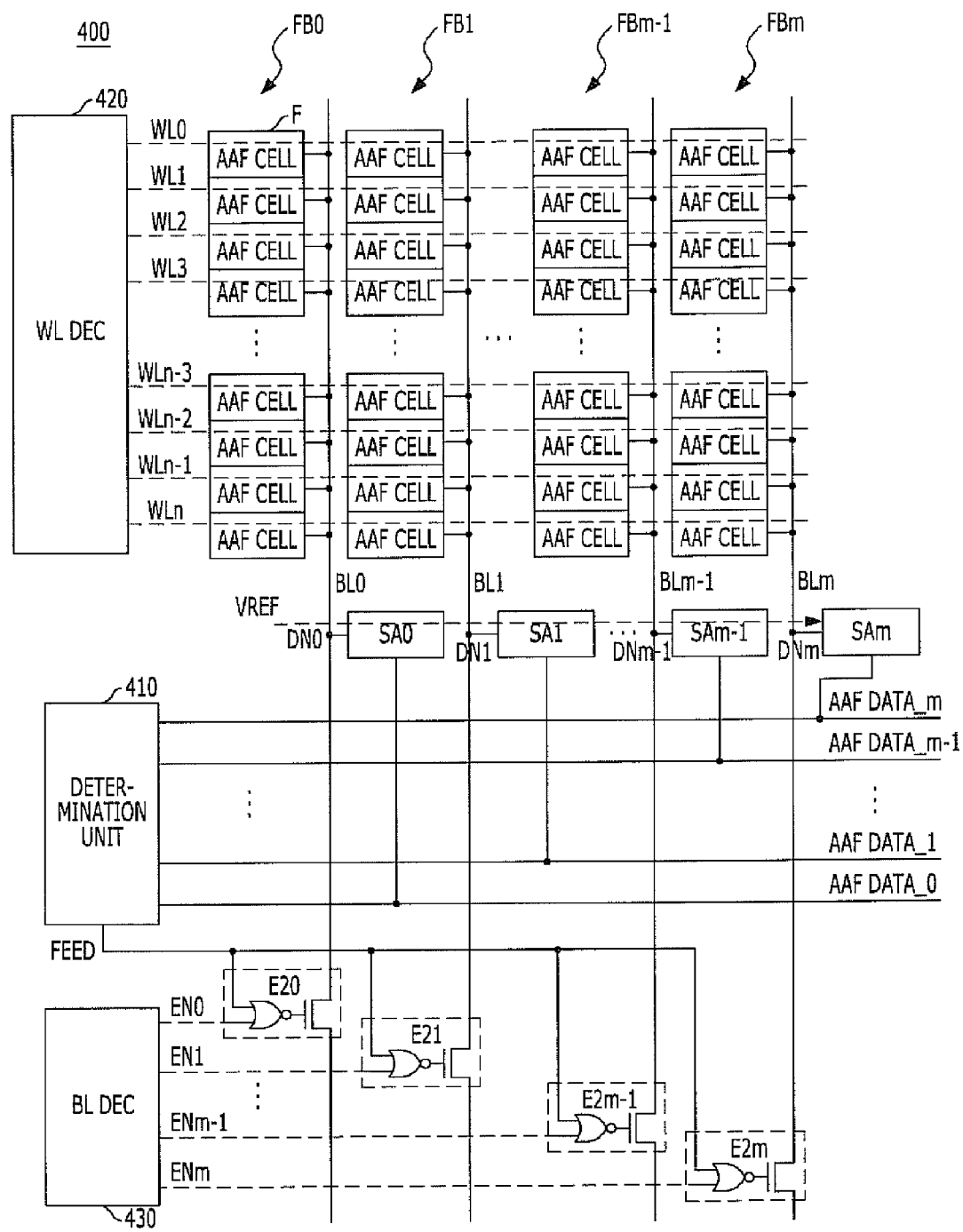
FIGS. 7 and 8 are configuration diagrams of a semiconductor device in accordance with a third exemplary embodiment of the present invention.

FIG. 7 is a configuration diagram of a semiconductor device 400 in accordance with a third exemplary embodiment of the present invention.

Referring to FIG. 7, the semiconductor device 400 includes a plurality of fuse blocks FB0 to FBm, a plurality of output units SA0 to SAm, a determination unit 410, a plurality of blocking units E20 to E2$m$, a word line decoder 420, and a bit line decoder 430. The plurality of fuse blocks FB0 to FBm each include a plurality of fuse units AAF_CELL connected in parallel to a corresponding one of a plurality of detection nodes DN0 to DNm and configured to receive a power supply voltage VDD through a plurality of word lines WL0 to WLn, respectively. The plurality of output units SA0 to SAm are connected to the respective detection nodes DN0 to DNm and configured to selectively output respective fuse information signals AAF_DATA_0 to AAF_DATA_m depending on whether corresponding fuse units AAF_CELL are programmed or not. The determination unit 410 is configured to determine whether the fuse units AAF_CELL included in the fuse blocks FB0 to FBm are programmed or not, in response to the fuse information signals AAF_DATA_0 to AAF_DATA_M outputted from the respective output units SA0 to SAm. The plurality of blocking units E20 to E2$m$ are configured to supply ground voltages VSS to the respective detection nodes DN0 to DNm in response to the respective enable signals EN0 to ENm and collective block the supply of the ground voltage in response to a program determination signal FEED outputted from the determination unit 410. The word line decoder 420 is configured to selectively supply the power supply voltage VDD through the plurality of word lines WL0 to WLn. The bit line decoder 430 is configured to selectively supply the enable signals EN0 to ENm.

Here, each of the fuse units AAF_CELL includes an anti-fuse, and the anti-fuse is programmed by a voltage difference between both ends thereof, for example, as the power supply voltage VDD and the ground voltage VSS are applied to both ends (refer to FIGS. 1 to 2B).

Furthermore, the plurality of output units SA0 to SAm include sense amplifiers configured to amplify voltages applied to the respective detection nodes DN0 to DNm using a common reference voltage VREF.

Furthermore, the determination unit 410 may include logic elements such as an OR gate, a NOR gate, an AND gate, and a NAND gate. When any one of the fuse information signals AAF_DATA_0 to AAF_DATA_m changes to a different level, the determination unit 410 activates the program determination signal FEED and controls all of the blocking units E20 to E2m to perform a blocking operation.

Furthermore, the plurality of blocking units E20 to E2m include NOR gates and NMOS transistors, respectively. The NOR gates are configured to perform a NOR operation on the program determination signal FEED outputted from the determination unit 410 and the respective enable signals EN0 to ENm. The NMOS transistors have gate terminals configured to receive output signals of the NOR gates and drain and source terminals connected between the respective detection nodes DN0 to DNm and the ground voltage terminal VSS.

Meanwhile, although not illustrated, the semiconductor device 400 may further include a plurality of delay units configured to delay the respective fuse information signals AAF_DATA_0 to AAF_DATA_m outputted from the respective output units SA0 to SAm by a given delay time and transfer the delayed signals to the determination unit 410 (refer to FIG. 4). This is in order to sufficiently secure a program time for the fuse unit AFF_CELL to prevent the occurrence of a recovery phenomenon where the fuse unit AFF_CELL returns to the previous state after the fuse unit AFF_CELL is programmed. In other words, since the anti-fuse is highly likely to recover immediately after the anti-fuse is ruptured, the plurality of delay units DLY0 to DLYm are provided to terminate the rupture operation after securing a time taken for the anti-fuse not to recover.

Hereinafter, a method for driving the semiconductor device 400 in accordance with the third embodiment of the present invention will be described. In the third embodiment of the present invention, a case in which a first fuse unit AAF_CELL indicated by F in FIG. 7 is programmed will be shown as an example for description.

First, the first fuse unit F is selected by a combination of the word lines WL0 to WLn and the bit lines BL0 to BLm. That is, the word line decoder 420 supplies the power supply voltage VDD through the first word line WL0 and supplies the ground voltage VSS through the other word lines WL1 to WLn. Furthermore, the bit line decoder 430 activates the first enable signal EN0 to a logic high level (for example, VDD) and deactivates the other enable signals EN1 to ENm to a logic low level (for example, VSS). Then, the first bit line BL0 is selected to connect the first detection node DN0 to the ground voltage terminal VSS. Here, the plurality of output units SA0 to SAm may output the high-level fuse information signals AAF_DATA_0 to AAF_DATA_m before the fuse units AAF_CELL are programmed, and the determination unit 420 may output the low-level program determination signal FEED in response to the high-level fuse information signals AAF_DATA_0 to AAF_DATA_m.

Accordingly, the power supply voltage VDD and the ground voltage VSS are applied to both ends of the first fuse unit F, and the first fuse unit F is programmed by a voltage difference between the power supply voltage VDD and the ground voltage VSS. That is, the anti-fuse included in the first fuse unit F is switched from an insulator having a high resistance of MΩ or more to a conductor having a low resistance of several hundred Ω or less by the voltage difference between both ends.

Then, while the first detection node DN0 is connected to the ground voltage terminal VSS, the first output unit SA0 outputs the low-level first fuse detection signal AAF_DATA_0, and the determination unit 420 outputs the high-level program determination signal FEED in response to the low-level first fuse detection signal AAF_DATA_0.

Therefore, the plurality of blocking units E20 to E2m collectively perform a blocking operation, regardless of the logic levels of the respective enable signals EN0 to ENm. At this time, a current path formed in the first bit line BL0 is blocked.

Figure 8:
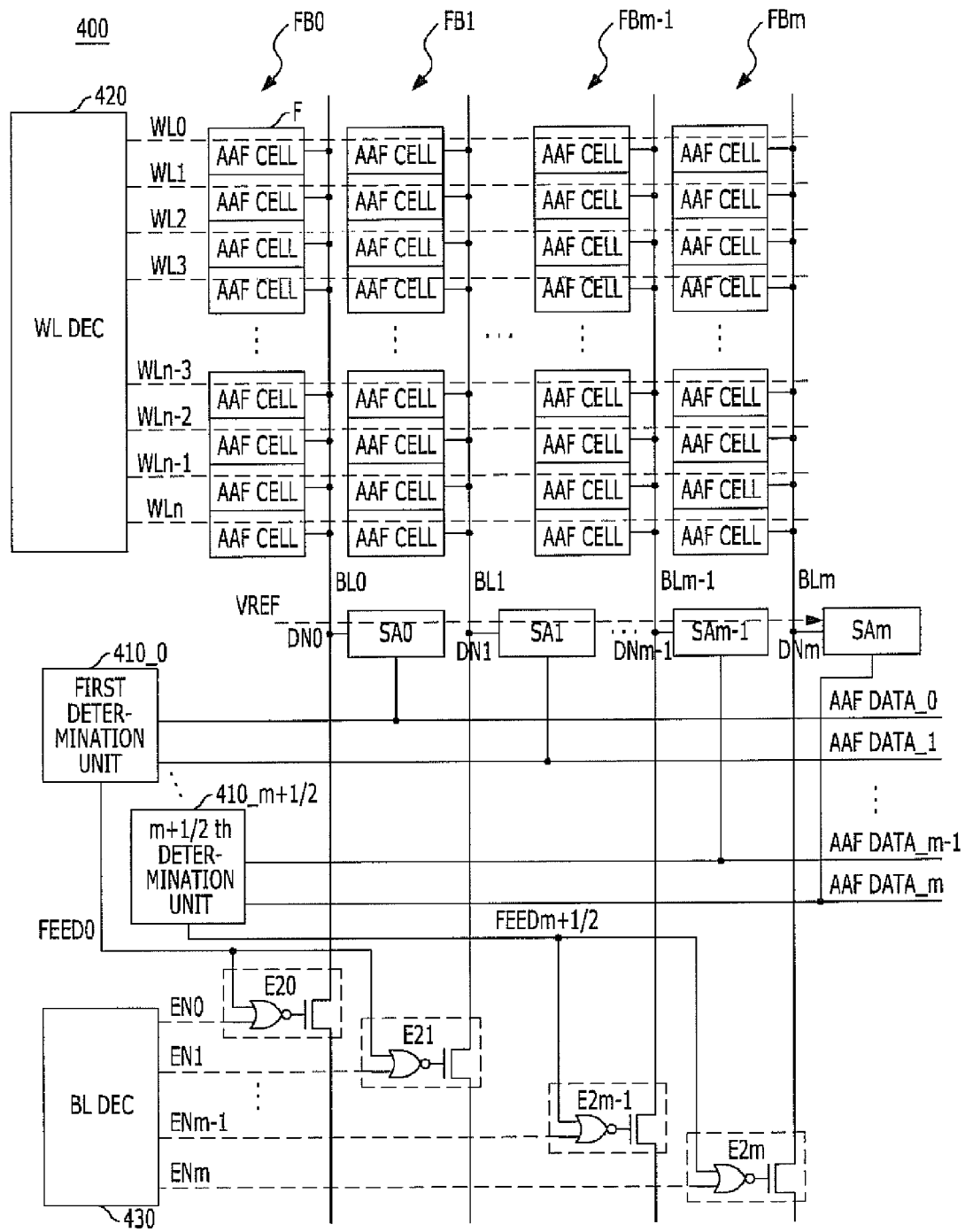

In the third embodiment of the present invention, it has been described that the determination unit 410 outputs one program determination signal FEED in response to the plurality of fuse information signals AAF_DATA_0 to AAF_DATA_m, but the present invention is not limited thereto. That is, the plurality of fuse information signals AAF_DATA_0 to AAF_DATA_m may be grouped by a given number, and a plurality of determination units 410_0 to 410_m+½ may be provided in correspondence to the group number. In this case, the plurality of blocking units E20 to E2m are designed to be grouped by the given number in response to the grouping and partially perform a blocking operation in response to output signals FEED_0 to FEED_m+½ of the corresponding determination units. For example, referring to FIG. 8, when any one of the first and second fuse information signals AAF_DATA_0 and AAF_DATA_1 transits to a given logic level, the first and second blocking units E20 and E21 block current paths of the first and second bit lines BL0 and BL1 under the control of the first determination unit 410_0. Similarly, when any one of the m-th and (m+1)-th fuse information signals AFF_DATA_m−1 and AAF_DATA_m transits to a given logic level, the m-th and (m+1)-th blocking units E2m−1 and E2m block current paths of m-th and (m+1)-th bit lines BLm−1 and BLm under the control of the (m+½)-th determination unit 410_m+½.

In accordance with the embodiments of the present invention, when a selected fuse unit is completely programmed, a current path formed in a corresponding bit line may be blocked, thereby reducing current consumption. Furthermore, as current consumption is reduced, power noise of a supply voltage may be minimized to stabilize a supply voltage. Therefore, the operation reliability may be improved during a program operation, and a time taken for successive program operations may be minimized.

While the present invention has been described with respect to the specific embodiments, it will be apparent to those skilled in the art that various changes and modifications may be made without departing from the spirit and scope of the invention as defined in the following claims.

For example, in these embodiments of the present invention, a case in which an anti-fuse is programmed by applying the power supply voltage VDD and the ground voltage VSS to both ends of the anti-fuse was shown as an example for description, and but the present invention is not limited thereto. Depending on different designs, a high voltage such as a pumping voltage VPP and a low voltage such as a substrate bias voltage VBB may be used to program an anti-fuse.

What is claimed is:

1. A semiconductor device comprising:
a fuse unit connected to a detection node and configured to be programmed in response to a first voltage supplied through the detection node;
an output unit connected to the detection node and configured to output a fuse information signal indicating whether or not the fuse unit is programmed;
a decoder configured to supply an enable signal of a blocking unit; and
the blocking unit configured to block the first voltage supplied through the detection node in response to the fuse information signal of a low logic level regardless of the enable signal after the fuse unit is programmed,
wherein the fuse information signal is initiated to a high level and the enable signal has a low level, so that first voltage is not applied to the detection node before the fuse unit is programmed,
wherein the enable signal transits to a high level in a state that the fuse information signal maintains the high level, so that the first voltage is applied to the detection node thereby the fuse unit is programmed,
wherein the fuse information signal maintains the low logic level by applying the first voltage to the detection node, so that the first voltage is not applied to the detection node even though the enable signal has a high level after the fuse unit is programmed.

2. The semiconductor device of claim 1, wherein the fuse unit comprises an anti-fuse programmed by voltage difference between the first voltage and a second voltage supplied thereto.

3. The semiconductor device of claim 1, wherein the output unit comprises a sense amplifier configured to amplify a voltage at the detection node based on a reference voltage.

4. The semiconductor device of claim 1, further comprising:
a delay unit configured to delay the fuse information signal outputted from the output unit by a set delay time and transfers the delayed signal to the blocking unit.

5. A semiconductor device comprising:
a plurality of detection nodes;
a plurality of fuse blocks each comprising a plurality of fuse units configured to be programmed in response to first program voltages of respective input nodes and a second program voltage of one of the detection nodes;
a plurality of output units configured to selectively output respective fuse information signals indicating whether or not the fuse units of the respective fuse blocks are programmed;
a second decoder configured to supply the respective enable signals to a plurality of switching units; and
the plurality of switching units configured to supply the second program voltage to the respective detection nodes in response to respective enable signals and block the second program voltage supplied to the respective detection nodes in response to the respective fuse information signals of a second logic level regardless of the respective enable signals after the fuse unit is programmed,
wherein the fuse information signals are initiated to a high level and the enable signal has a tow level, so that second program voltage is not applied to the detection node before the fuse unit is programmed,
wherein the enable signal transits to a high level in a state that the fuse information signals maintain the high level, so that the second program voltage is applied to the detection node thereby the fuse unit is programmed,
wherein the fuse information signals maintain the second logic level by applying the first voltage to the detection node, so that the second program voltage is not applied to the detection node(DN) even though the enable signal (EN) has a high level alter the fuse unit is programmed.

6. The semiconductor device of claim 5, further comprising:
a determination unit configured to determine whether the fuse units of the fuse blocks are programmed or not, in response to the fuse information signals, and output at least one program determination signal to the plurality of switching units as the respective fuse information signals.

7. The semiconductor device of claim 6, wherein the determination unit comprises a plurality of signal summing sections each corresponding to two or more of the plurality of output units and configured to generate the program determination signal in response to the fuse information signals outputted from the two or more of the output units.

8. The semiconductor device of claim 5, further comprising:
a first decoder configured to selectively supply the first program voltages to the plurality of fuse units.

9. The semiconductor device of claim 5. wherein the first program voltage comprises a power supply voltage, and the second program voltage comprises a ground voltage.

10. The semiconductor device of claim 5, wherein each of the fuse units comprises an anti-fuse.

11. The semiconductor device of claim 5, wherein the plurality of output units comprise sense amplifiers configured to amplify voltages applied to the respective detection nodes based on a common reference voltage.

12. The semiconductor device of claim 5, further comprising:
a plurality of delay units configured to delay the fuse information signals outputted from the respective output units by a set delay time and transfer the delayed signals to the respective switching units.

13. The semiconductor device of claim 12, wherein the set delay time comprises a recovery time for the fuse unit which is programmed.

14. A semiconductor device comprising:
a plurality of detection nodes;
a plurality of fuse blocks each comprising a plurality of fuse units configured to be programmed in response to first program voltages of respective input nodes and a second program voltage of one of the detection nodes;
a plurality of output units configured to selectively output respective fuse information signals indicating whether the fuse units of the respective fuse blocks are programmed or not;
a determination unit configured to determine whether or not the fuse traits of the fuse blocks are programmed, in response to the fuse information signals, and output at least one program determination signal;
a plurality of switching units configured to block the second program voltage to the respective detection nodes in response to the fuse information signals of a second logic level regardless respective enable signals after the fuse unit is programmed;
a first decoder configured to selectively supply the first program voltages to the plurality of fuse units; and
a second decoder configured to selectively generate the enable signals and deactivate a part or all of the enable signals in response to the program determination signal,
wherein the fuse information signals are initiated to a high level and the enable signal has a low level, so that second program voltage is not applied to the detection node before the fuse unit is programmed, wherein the enable signal transits to a high level in a state that the fuse information signals maintain the high level, so that the second program voltage is applied to tile detection node thereby the fuse unit is programmed, wherein the fuse information signals maintain the second logic level by applying the first voltage to the detection node, so that the second program voltage is not applied to the detection node even though the enable signal has a high level after the fuse unit is programmed.

15. The semiconductor device of claim 14, wherein the determination unit comprises a plurality of signal summing sections each corresponding to two or more of the plurality of output units and configured to generate the program determination signal in response to the fuse information signals outputted from the two or more of the output units.

16. The semiconductor device of claim 14, wherein the first program voltage comprises a power supply voltage, and the second program voltage comprises a ground voltage.

17. The semiconductor device of claim 14, wherein each of the fuse units comprises an anti-fuse.

18. The semiconductor device of claim 14, wherein the plurality of output units comprise sense amplifiers configured to amplify voltages at the respective detection nodes based on a common reference voltage.

19. The semiconductor device of claim 14, further comprising a plurality of delay units configured to delay the fuse information signals outputted from the respective output units by a set delay time and transfer the delayed signals to the determination unit.

20. The semiconductor device of claim 19, wherein the set delay time comprises a recovery time for the fuse unit which is programmed.

* * * * *